United States Patent
Redinbo et al.

(10) Patent No.: US 6,374,150 B2
(45) Date of Patent: *Apr. 16, 2002

(54) METHOD AND APPARATUS FOR MONITORING AND/OR END POINT DETECTING A PROCESS

(75) Inventors: Gregory F. Redinbo, San Jose; Jallepally Ravi, Santa Clara; Michael Rivkin, Sunnyvale, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/126,552

(22) Filed: Jul. 30, 1998

(51) Int. Cl.[7] ............................. G06F 19/00; G01J 5/00
(52) U.S. Cl. ......................................... 700/121; 374/128
(58) Field of Search ................................ 700/121, 123, 700/204, 120, 118, 119, 299, 300; 427/8; 374/128, 7; 219/390; 438/95

(56) References Cited

U.S. PATENT DOCUMENTS

| 5,196,353 A | * | 3/1993 | Sandhu | 437/8 |
|---|---|---|---|---|
| 5,407,534 A | * | 4/1995 | Thakur | 156/662 |
| 5,490,728 A | * | 2/1996 | Schietinger | 374/7 |
| 5,629,223 A | * | 5/1997 | Thakur | 438/398 |
| 5,650,082 A | * | 7/1997 | Anderson | 219/390 |
| 5,656,531 A | * | 8/1997 | Thakur | 438/398 |
| 5,660,472 A | * | 8/1997 | Peuse | 374/128 |
| 5,688,550 A | * | 11/1997 | Weimer | 427/8 |
| 5,753,559 A | * | 5/1998 | Yew | 438/398 |
| 5,755,511 A | * | 5/1998 | Peuse et al. | 374/128 |
| 5,759,894 A | * | 6/1998 | Tseng | 438/255 |
| 5,770,500 A | * | 6/1998 | Batra | 438/255 |
| 5,798,280 A | * | 8/1998 | Mathews | 437/165 |
| 5,837,580 A | * | 11/1998 | Thakur | 438/255 |
| 5,918,111 A | * | 6/1999 | Kohara et al. | 438/95 |
| 6,179,466 B1 | * | 1/2001 | Peuse et al. | 374/128 |

OTHER PUBLICATIONS

Enclosed copy of International PCT Search Report (PCT/US 99/17247).

* cited by examiner

Primary Examiner—William Grant
Assistant Examiner—Ronald D Hartman, Jr.
(74) Attorney, Agent, or Firm—Blakely Sokoloff Taylor & Zafman

(57) ABSTRACT

The present invention describes a method of end point detecting a process. According to the present invention a surface characteristic is continually measured while the substrate is being processed. A predetermined change in the surface characteristic is utilized a signal and end to the processing step.

7 Claims, 14 Drawing Sheets

METHOD AND APPARATUS FOR MONITORING AND/OR END POINT DETECTING A PROCESS

BACKGROUND OF THE INVENTION

1. Field of the Invention

The present invention relates to the field of semiconductor processing and more specifically to a method and apparatus for monitoring or the end point detecting a process.

2. Discussion of Related Art

As dynamic random access memories (DRAMs) devices increase in storage density from 16 Mb to 64 Mb and beyond there is a need to maintain charge storage capabilities with a decrease in memory cell size. This requirement has been met by increasing the surface area of the storage capacitor within the memory cell. Several complex storage electrode designs have been implemented, including thin and cylindrical "crown" capacitor structures in order to obtain increased storage surface area.

Another approach, as illustrated in FIG. 1a, is to form a capacitor 100 having a lower capacitor electrode 102 formed from a polysilicon film having a roughened surface 104. A polysilicon film having a roughened surface can be generated by forming a polysilicon film with hemispherical grains (HSG silicon). Because electrode 102 has a rough surface, the surface area between top electrode 106 and bottom electrode 102 is increased enabling more charge storage for a given cell size. A polysilicon storage electrode 102 with a rough surface can increase the capacitor area by more than 2×.

The most wide spread approach for forming a polysilicon film with a rough surface or hemispherical grains has been to deposit a thin (less than 1,000 angstroms) rough polysilicon film in the batch furnace, such as shown in FIG. 1b. The batch furnace 120 illustrated in FIG. 1b is a low pressure chemical vapor deposition (LPCVD) system having a chamber 110 which includes a boat 111 carrying a batch (approximately 100) of substrates. A gas feed from a gas source 113 is controlled by a controller 114 and enters the chamber 110 from a gas inlet port 115. The gas feed is maintained across the substrates 112 in the direction of the arrows. The low pressure in the chamber 110 is maintained by exhaust system 116. Because the concentration of fed gases can decrease the flow toward the exhaust system 116 the chamber also includes three separately controlled heater eliminates 117 that provide temperature variations in chamber 110 to compensate for variations of concentration of the reactant gases within chamber 110.

A problem associated with present techniques of forming HSG silicon is that there is presently no way to monitor or end point detect the formation of HSG silicon. It is to be appreciated that there is a relatively small process window (time) in which HSG grains have optimum size and shape in order to provide a maximum increase in the capacitor surface area. If the process time is too short too little HSG will form resulting in a insufficient increase in electrode surface area. If HSG process time is too long, the gaps between adjacent grains begin to fill in resulting in a smoothing of the roughened surface and a decrease in electrode surface area. Thus, without a technique to monitor and/or end point detect the formation of HSG silicon, HSG silicon processes will cause poor substrate to substrate uniformity and potentially be unmanufactureable.

Thus, what is desired is a method and apparatus for monitoring and/or end point detecting the formation of HSG silicon.

SUMMARY OF THE INVENTION

A method and apparatus for monitoring or end point detecting a process is described. According to the present invention a surface characteristic of the substrate is continually measured while processing the substrate. A change in the surface characteristic is utilized to monitor the process or to signal an end to the processing of the substrate.

In an embodiment of the present invention, a change in a surface characteristic of a substrate is utilized to monitor or to signal the end to a process for forming hemispherical grain (HSG) silicon. In such a process a substrate having an external amorphous silicon film is placed in a process chamber. The substrate is then heated to form hemispherical grains from the amorphous silicon film. While heating the substrate a surface characteristic is continually monitored. A predetermined change in the surface characteristic is utilized to signal the completion of hemispherical grain silicon formation and therefore an end to the heating step.

In an embodiment of the present invention the emissivity of a substrate is utilized to monitor or to signal the end point of a process used to form HSG silicon. According to this embodiment of the present invention a substrate having an amorphous silicon film is placed in a process chamber and heated to form hemispherical grain (HSG) silicon from the amorphous silicon film. While heating the substrate the emissivity of the substrate is continually monitored. A predetermined change in the emissivity of the substrate is utilized to monitor the process or to signal an end to the heating step.

In another embodiment of the present invention the temperature of a substrate is utilized to monitor or to signal the end point of a process used to form HSG silicon. According to this embodiment of the present invention a substrate having an amorphous silicon is placed in a process chamber and heated to form hemispherical grain silicon from the amorphous silicon film. While heating the substrate with a constant amount of heat the temperature of the substrate is continually monitored. A predetermined change in the temperature of the substrate is utilized to monitor the process and/or to signal an end to the heating step.

In still another embodiment of the present invention while processing a substrate, the temperature of the substrate is monitored utilizing a temperature measurement device which is substantially independent of the substrates emissivity. Additionally while processing the semiconductor substrate the temperature of the substrate is also monitored utilizing a temperature measurement device which is dependent on the substrate's emissivity. While processing the substrate, the difference between the temperature measured by substantially emissivity independent measurement device and the temperature measured by emissivity dependent measurement device is calculated. A change in the difference between the temperature measured by the substantially emissivity independent measurement device and the temperature measured by the emissivity dependent measurement device is then utilized to monitor the process and/or to signal an end to the processing step.

In still yet another embodiment of the present invention a substrate is heated with a closed loop temperature control system which through temperature feedback maintains the substrate at a constant temperature. The amount of power utilized by the temperature control system is continually monitored while heating the substrate. A change in the amount of power required by the temperature control system is used to monitor the process and/or to signal an end to the heating step Other embodiments and features of the present invention will become obvious from the detailed description which follows.

BRIEF DESCRIPTION OF THE DRAWINGS

FIG. 2c-2 is an illustration of an overhead view showing the seeding of the substrate of FIG. 2b.

FIG. 2d-1 is an illustration of a cross-sectional view showing the onset of HSG silicon on the substrate of FIG. 2c.

FIG. 2d-2 is an illustration of an overhead view showing the onset of HSG silicon on the substrate of FIG. 2c.

FIG. 2e-1 is an illustration of a cross sectional view showing the formation of larger grains on the substrate at FIG. 2d.

FIG. 2e-2 is an illustration of an overhead view showing the formation of larger grains on the substrate of FIG. 2d.

FIG. 2f-1 is an illustration of a cross-sectional view showing the formation of optimal sized and shaped HSG silicon on the substrate of FIG. 2e.

FIG. 2f-2 is an illustration of an overhead view showing the formation of optimal sized and shaped HSG silicon on the substrate of FIG. 2e.

FIG. 2g-1 is a cross-sectional views showing the smoothing of the HSG silicon grains due to over annealing the substrate of FIG. 2f.

FIG. 2g-2 is an illustration of an overhead view showing the smoothing of HSG silicon due to the over annealing of the substrate of FIG. 2f.

FIG. 3d illustrates the difference between the temperatures measured between a substantially emissivity independent probe and an emissivity dependent probe during the formation of HSG silicon.

FIG. 4b is an illustration of the light source placement in the rapid thermal heating apparatus of FIG. 4a.

DETAILED DESCRIPTION OF THE PRESENT INVENTION

Figure 1A:
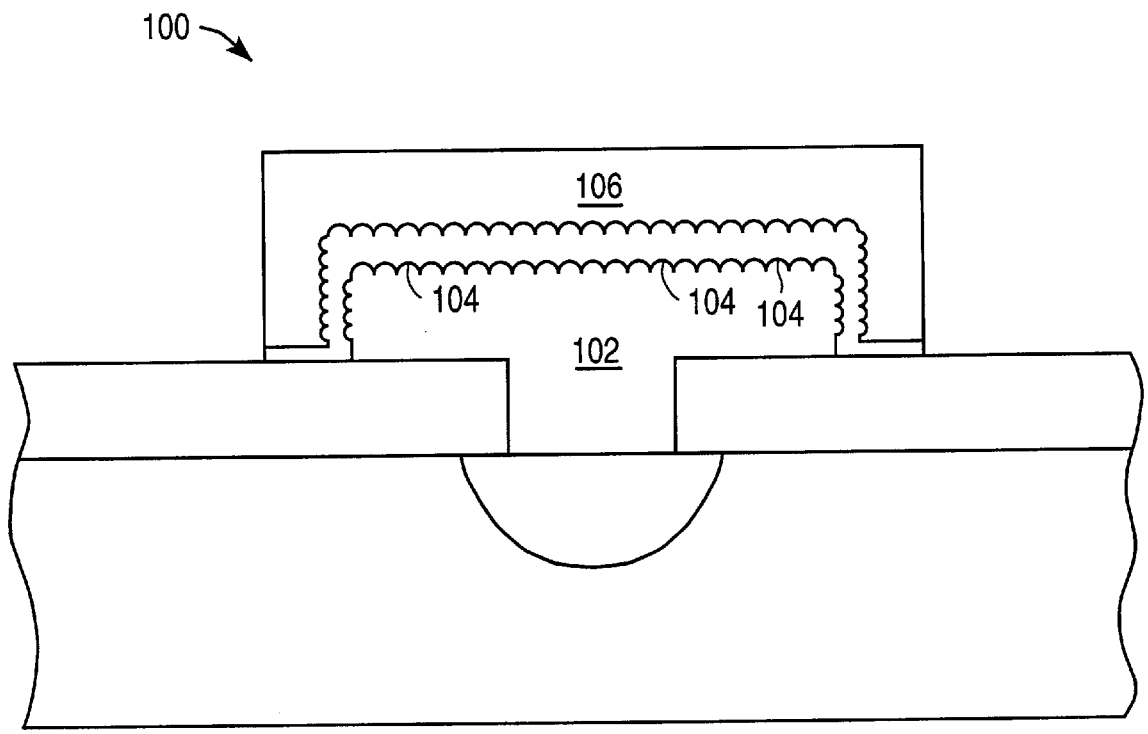
FIG. 1a is an illustration of a cross-sectional view showing the formation of a capacitor having an HSG polysilicon bottom electrode.

The present invention describes a novel method and apparatus for monitoring and/or end point detecting a fabrication process. In the following description, numerous specific details are set forth such as specific equipment configurations and process steps in order to provide a thorough understanding of the present invention. It will be obvious, however, to one skilled in the art that the present invention may be practiced without these specific details. In other instances well known semiconductor equipment and manufacturing techniques have not been described in particular detail in order to not unnecessarily obscure the present invention.

The present invention describes a novel method and apparatus for monitoring and/or detecting an end point detecting of a substrate processing step. According to the present invention a substrate surface characteristic, such as but not limited to surface emissivity or surface temperature, is monitored while the substrate is being processed. A predetermined change in the surface characteristic is utilized to monitor and/or a signal an end to the processing step.

In one embodiment of the present invention the surface emissivity of a substrate is used to signal the end point of a process used to fabricate hemispherical grain (HSG) silicon on a substrate. During an annealing step which transforms an amorphous silicon film into a polycrystalline silicon film with hemispherical grains (HSG) or a rough surface, the emissivity of the substrate is monitored. As the hemispherical grains grow, the emissivity of the substrate changes (e.g. decreases) due to a rough surface being formed on a previously smooth amorphous silicon film. As large polysilicon grains began to grow, and the surface of the silicon film becomes rougher, the emissivity of the substrate decreases. By continually monitoring, in real time, the emissivity of the substrate, one can use a change in the emissivity of the substrate to monitor the HSG formation step and/or to signal the completion of the HSG formation step. By closely monitoring changes in the surface emissivity of the substrate one can determine the onset of grain formation, determine when grains have reached their optimum size or shape, and determine when grains have become over grown and filled in. In this way, the length of the anneal step can be precisely controlled, at any temperature, to precisely generate any desired film roughness.

In another embodiment of the present invention the temperature of a substrate is utilized to monitor and/or to signal the end point of a process used to form HSG silicon. According to this embodiment of the present invention, a substrate having an amorphous silicon film is placed in a process chamber having an open loop temperature control system and heated to form hemispherical grain silicon from the amorphous silicon film. While providing a constant amount of heat, to the substrate the temperature of the substrate is continually monitored. A predetermined change in the temperature of the substrate is utilized to monitor the process or to signal an end to the heating step.

In still another embodiment of the present invention while processing a semiconductor substrate, the temperature of the substrate is monitored utilizing a temperature measurement device which is substantially independent of the substrate's emissivity. Additionally while processing the semiconductor substrate the temperature of the substrate is also monitored utilizing a temperature measurement device which is dependent on the substrate's emissivity. While processing the substrate, the difference between the temperature measured by the substantially emissivity independent measurement device and the temperature measured by emissivity dependent measurement device is calculated. A change in the difference between the temperature measured by the substantially emissivity independent measurement device and the temperature measured by the emissivity dependent measurement device is then utilized to monitor the process and/or to signal an end to the processing step.

In yet still another embodiment of the present invention a change in the amount of power consumed by a closed loop temperature control system of a thermal processor is used to monitor and/or to indicate completion of HSG silicon formation. In this embodiment of the present invention, a closed loop temperature control system is used to maintain a substrate at a constant temperature set point during processing. Any change in the substrates temperature from the set point temperature causes a corresponding increase or decrease in the amount of power supplied to heating sources so that more or less heat will be provided to the substrate so that the substrates temperature can be maintained at the set point temperature. When HSG silicon is formed by transforming an amorphous silicon film into a polycrystalline silicon film with a rough surface, the temperature of the substrate changes due to its increasing surface roughness. In an attempt to maintain the substrate at the lower set point temperature the closed loop temperature control system reduces the amount of power supplied to the heat sources. As such, by continually monitoring the amount of power consumed by heat sources of a closed loop temperature control system the formation of HSG silicon can be monitored and/or end point detected.

The present invention will now be described with respect to a specific embodiment shown in FIGS. 2a–2h where a surface characteristic, such as emissivity or temperature, is monitored in order to monitor and/or end point detect the formation of a hemispherical grain (HSG) silicon film on a substrate. It is to be appreciated that the present invention is equally applicable to monitoring and/or end point detecting of other processes such as but not limited to the deposition of thin films, the change in crystallization of materials, the modification of the index of refraction of films, and the removal of thin films.

Figure 1B:
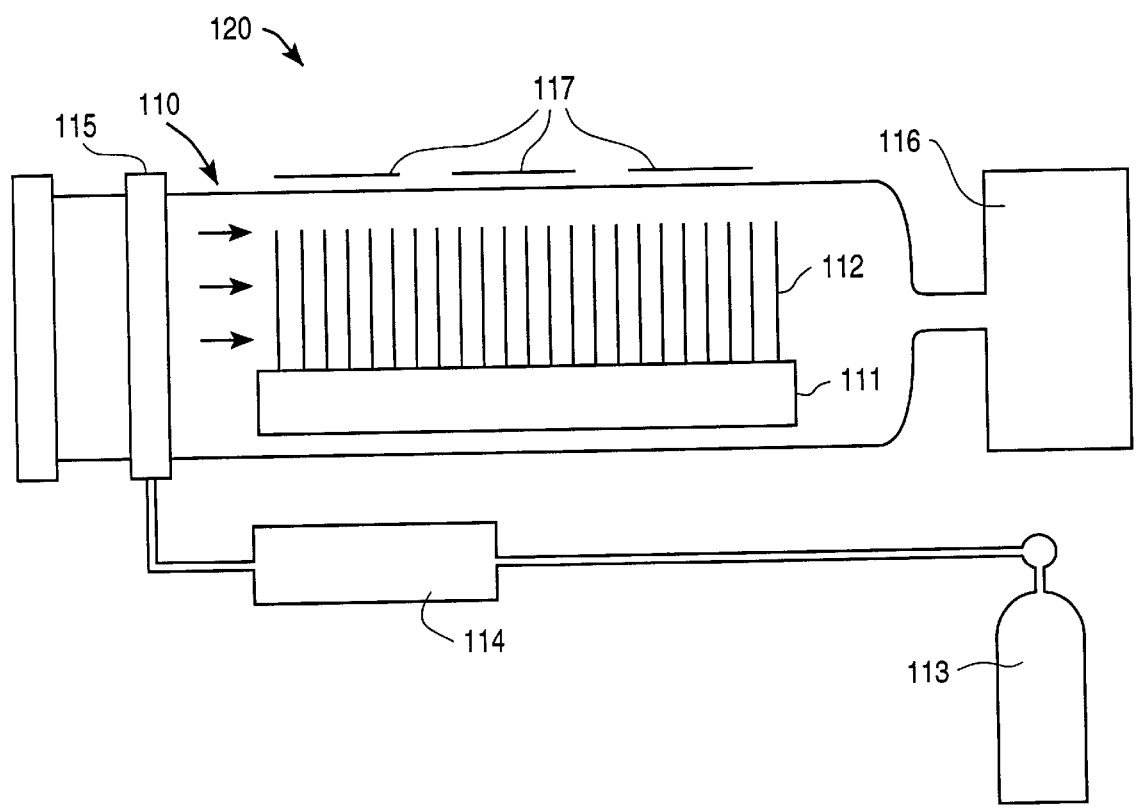
FIG. 1b is an illustration of a low pressure chemical vapor deposition (LPCVD) furnace.
Figure 2A:
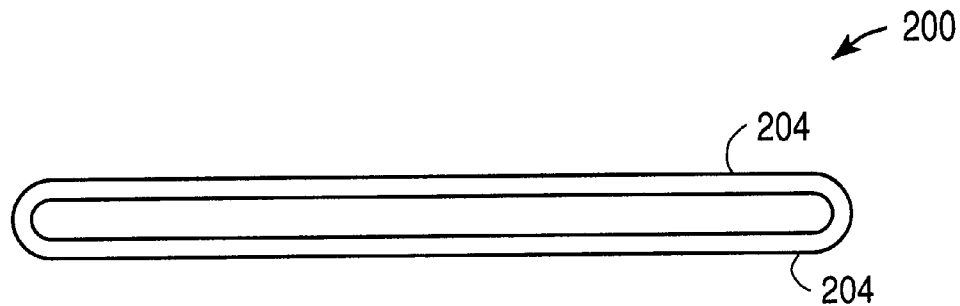
FIG. 2a is an illustration of a substrate having a amorphous silicon film from thereon.
Figure 2B:
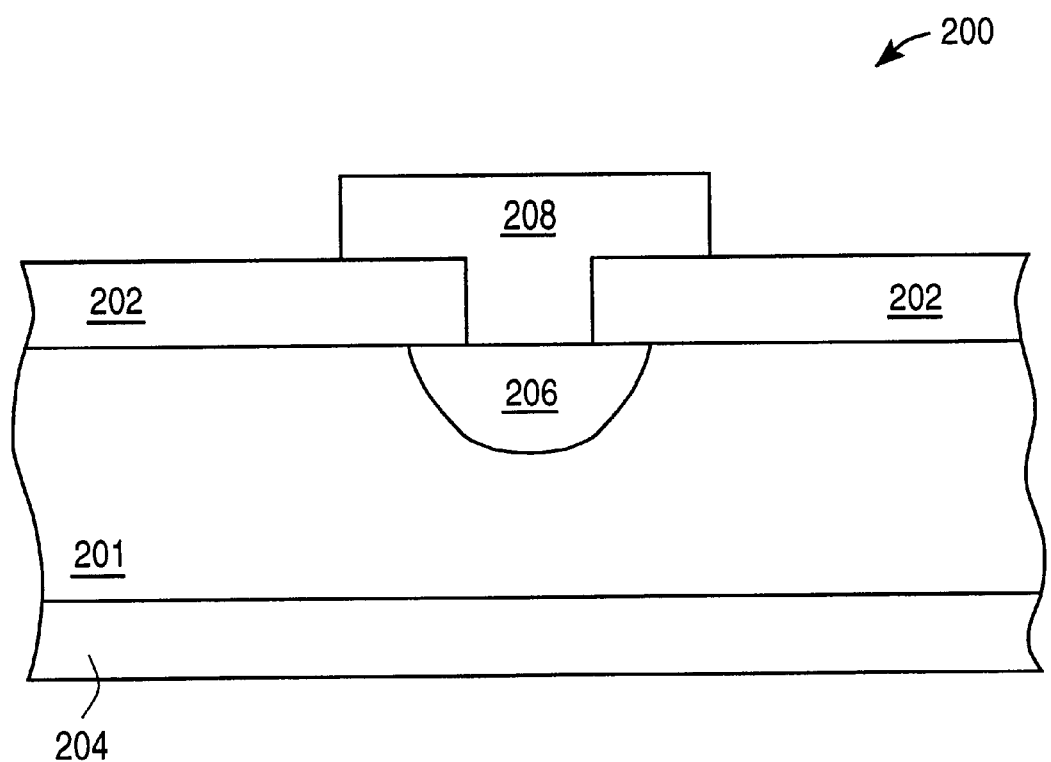
FIG. 2b is an illustration of a cross-sectional view of a substrate having an amorphous silicon bottom electrode.

In order to form an HSG silicon film, a substrate having an amorphous silicon film formed thereon, such as shown in FIG. 2a, is provided. In embodiment of the present invention where an HSG silicon film is to be used as a bottom electrode in a high density dynamic random access memory (DRAM), a substrate (or wafer) 200 will typically include a monocrystalline silicon substrate 201 having a patterned interlayered dielectric (ILD) 202 formed thereon. An amorphous silicon film 204 would then be blanket deposited over ILD 202 and in contact with a doped region 206 formed in monocrystalline silicon substrate 201. An amorphous silicon film 204 can be formed in a multisubstrate (batch) low pressure chemical vapor deposition (LPCVD) furnace, such as furnace 120 shown in FIG. 1b. Such a deposition process will deposit in amorphous silicon film 204 on the top surface of substrate 200 as well as on the bottom surface of substrate 200 as shown in FIG. 2a. The amorphous silicon film 204 can then be patterned into individual capacitor electrodes 208 as shown in FIG. 2b.

In order to transform the amorphous silicon film 204 into polycrystalline silicon having hemispherical grains (HSG) substrate 200 is placed into a thermal heating apparatus which is capable of monitoring a substrate characteristic, such as substrate emissivity or temperature, while the substrate is heated in the thermal heating apparatus. An example of a suitable heating apparatus is the Applied Materials RTP XE Centura with a Honeycomb source which is illustrated in FIGS. 4a–4d. Another suitable rapid thermal heating apparatus and its method of operation is set forth in U.S. Pat. No. 5,155,336 assigned to the assignee of the present application.

Figure 4A:
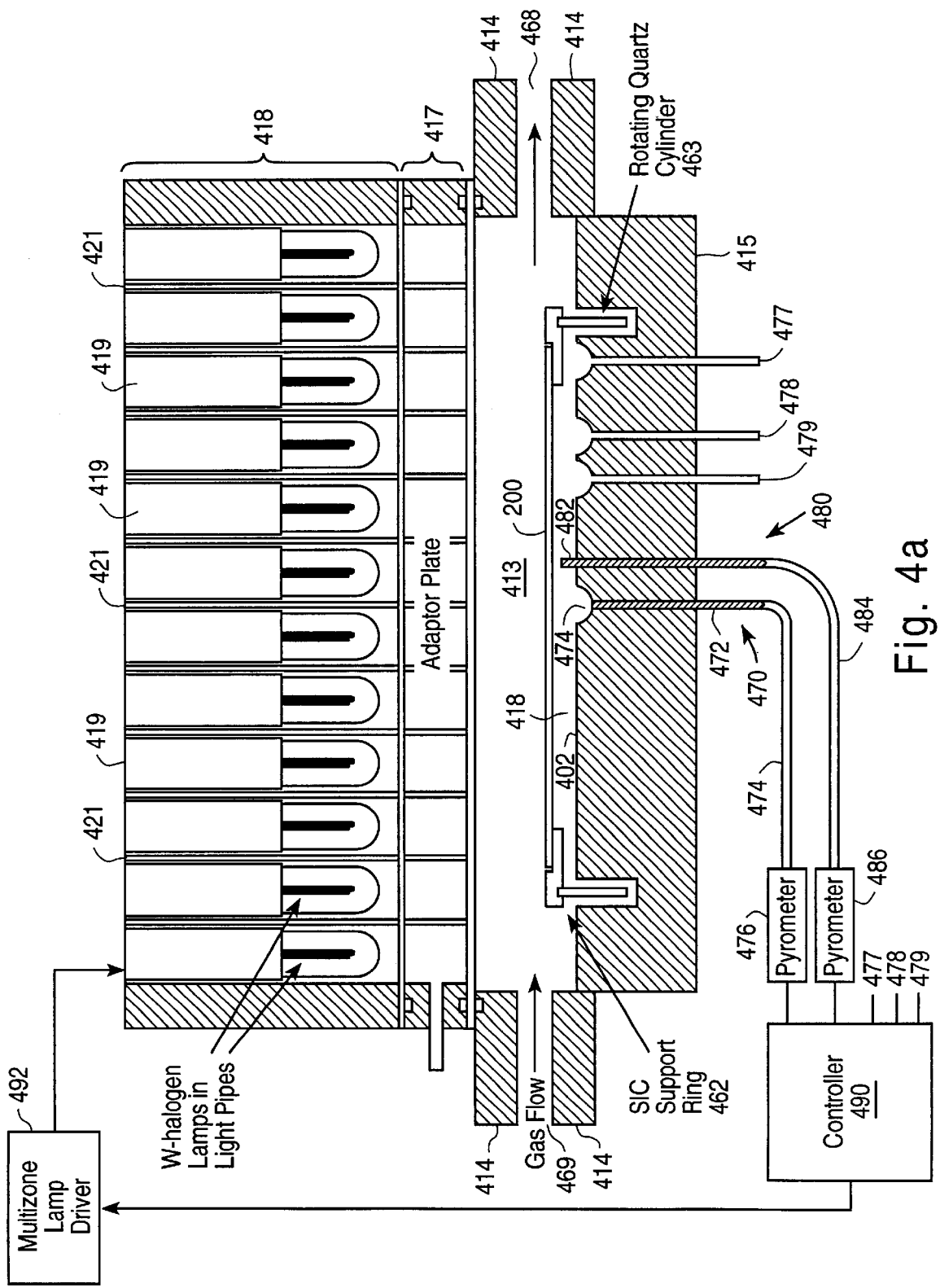
FIG. 4a is an illustration of a thermal heating apparatus which can be used to form HSG silicon and used to monitor and/or end point detect the formation of HSG silicon.

Rapid thermal heating apparatus 400, shown in FIG. 4a, includes an evacuated chamber 413 enclosed by a sidewall 414 in a bottom wall 415. A heating apparatus such as a radiant energy light pipe assembly 418 is positioned over and coupled to window assembly 417. The radiant energy assembly 418 includes a plurality a tungsten halogen lamps 419, for example Sylvania EYT lamps, each mounted into a light pipe 421 which can be stainless steel, brass, aluminum or metal. A substrate or substrate 200 is supported on its edge inside chamber 413 by a support ring 462 made of silicon carbide. Support ring 462 is mounted on a rotatable quartz cylinder 463. By rotating quartz cylinder 463 support ring 462 and substrate 200 can be caused to rotate.

Figure 4B:
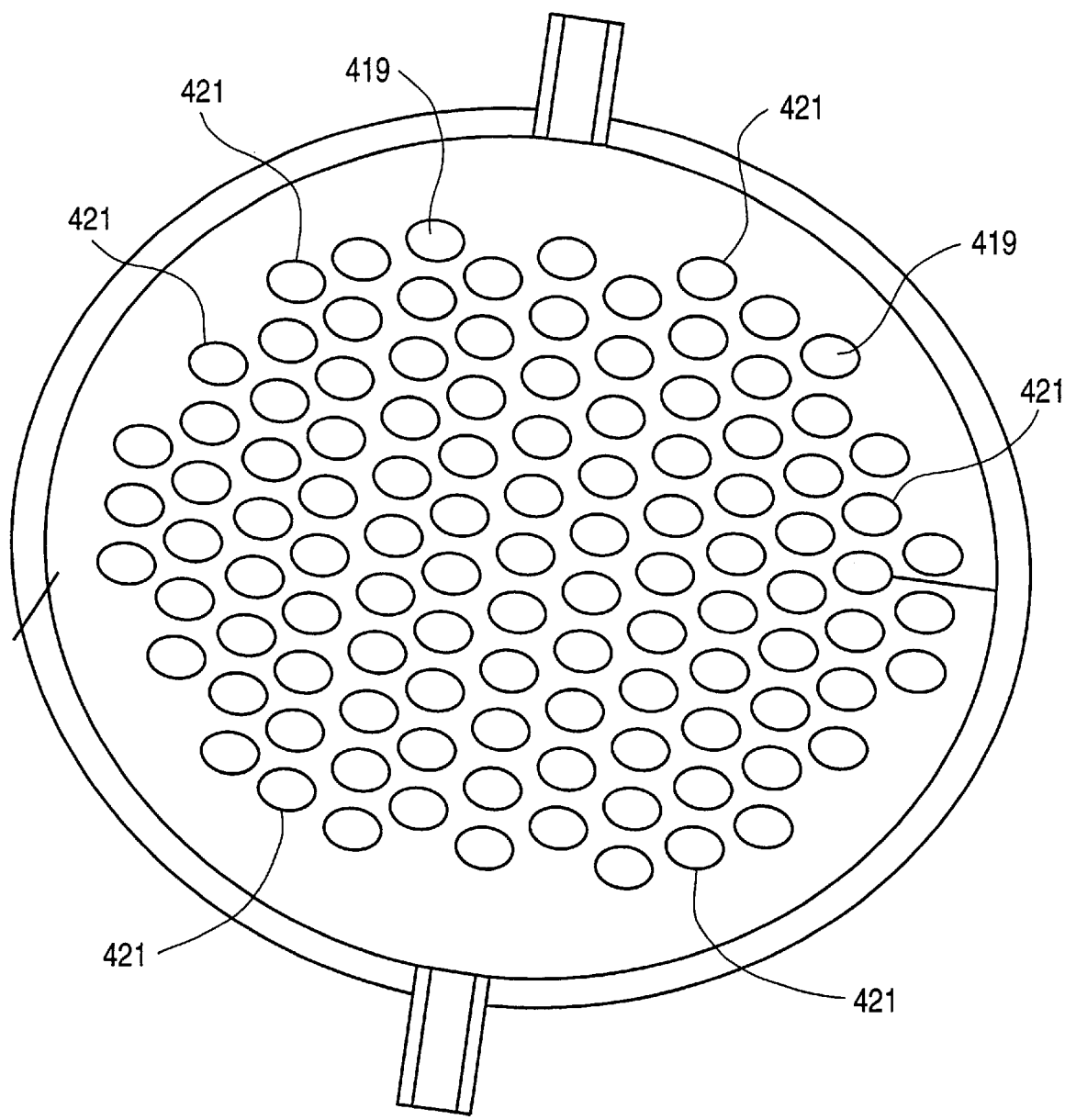

Rapid thermal heating apparatus 400 includes a gas inlet 469 form through a sidewall 414 for injecting process gas into chamber 413 to allow various processing steps to be carried out in chamber 413. Positioned on opposites sides of gas inlet 469 and sidewall 414 is a gas outlet 468. Gas outlet 468 is coupled to a vacuum source such as a pump to exhaust process gas from chamber 413 and to reduce the pressure in chamber 413. Process gas is generally fed into process chamber through gases inlets 469 and exhausted out through gas outlet 468 thereby creating a laminar flow over and parallel with the upper surface or face of substrate 200. Lamps 419 include a filament wound as a coil with an axis parallel to that of the lamp envelope. Most light is emitted perpendicular to the axis toward the wall of the surrounding light pipe. Light pipe length is selected to be at least as long as the associated lamp. Light assembly 418 preferably includes 187 lamps positioned in a hexagonal array or in a "honeycomb shape" as illustrated in FIG. 4b. Lamps 419 are positioned to adequately cover the entire surface of substrate 200 and support ring 462. Lamps 419 are grouped in zones which can be independently controlled to provide for extremely uniformed heating of substrate 200.

Rapid thermal heating apparatus 400 is a signal substrate reaction chamber capable of ramping the temperature of a substrate or substrate 200 at rate of 25–100° C./seconds. Heating/cooling fluid can be circulated through a sidewalls 414 and/or bottom wall 415 to maintain walls at a desired temperature. Rapid thermal heating apparatus 400 is preferably configured as part of a "cluster tool" which includes a loadlock and a transfer chamber with a robotic arm.

Rapid thermal heating apparatus 400 utilizes a virtual black body cavity which enables an accurate measurement of a substrates temperature and which enables the measurement of a substrates emissivity. Such a rapid thermal heating apparatus and its temperature measuring methodology is set forth in U.S. Pat. No. 5,660,472 assigned to the present assignee and which is hereby incorporated by reference. Beneath substrate 200 is a reflector 402 which is mounted onto water cool stainless steel base 415. Reflector 402 is made of aluminum and has a highly reflective surface coating 420 of for example gold. The underside of substrate 200 and the top of reflector 402 form a reflecting cavity or a virtual black body cavity 418 for enhancing the effective emissivity of the substrate (i.e. makes the substrate emissivity approximately one). When a 200 mm substrate is mounted on the silicon carbide support ring, the substrate is separated from the reflector by approximately 0.3 inches (7.6 millimeters) thereby forming a cavity 418 which has a width to height ratio of about 27.

Figure 4C:
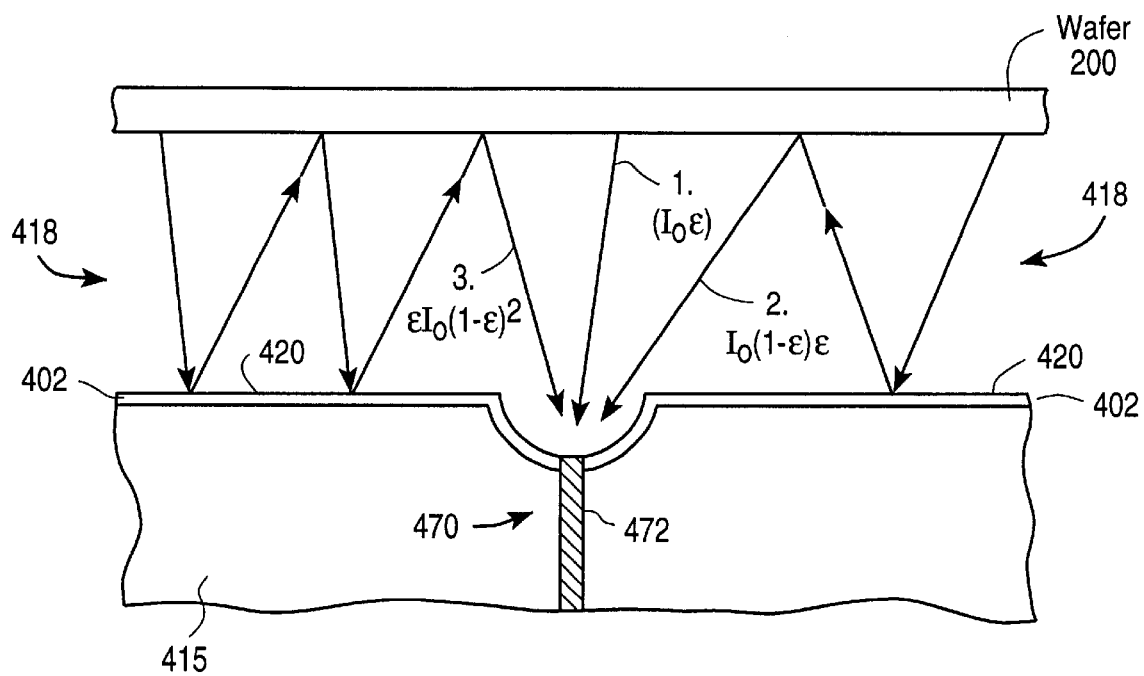
FIG. 4c illustrates the positioning of a temperature measurement device in a virtual black body cavity which is essentially emissivity independent.

The temperature of a localized region on the backside of substrate 200 is measured by a temperature measurement device 470. In one embodiment of the present invention as shown in FIG. 4a the temperature measurement device or probe 470 includes a light pipe 472 used to sample radiation in the cavity 418 through an aperture 474 formed in the reflector. The sampled intensity is passed through an optical fiber 474 to a pyrometer 476 where it is converted to a temperature. As shown in FIG. 4c aperture 474 of light pipe 472 receives radiation made up of many components: one component 480 is radiation received directly from the backside of substrate 200 and has no reflections; a second component 482 has experienced only one reflection off of reflector 462 and the backside of substrate 200; a third component 484 has experienced two reflections off of reflector 402 and the backside of substrate 200; etc. The total intensity received by light pipe 472 or any part of reflector plate can be found by summing over an infinite series of components of impinging radiation. A point on the reflector plate can be found by summing over an infinite series of components of impinging radiation as follows:

$$I = \varepsilon \sigma T^4 \sum_n R^n \cdot (1-\varepsilon)^n \quad \text{(Eq. 1a)}$$

$$I = \frac{\varepsilon \cdot \sigma \cdot T^4}{1 - R(1-\varepsilon)} \quad \text{(Eq. 1b)}$$

where the reflectivity of the cold reflector plate is given by R the emissivity of the substrate by $\in$ and where $\sigma$ is the Stefan-Boltzman constant and T is the temperature of the substrate.

Assuming that the reflectivity of the reflector is equal to one (R=1), then Eq. 1b reduces to:

$$I = \sigma T^4 \quad \text{(Eq. 1c)}$$

in which the radiation I is independent of emissivity of the backside of the substrate. Stated differently, the reflector produces a virtual blackbody cavity for which the "effective emissivity" of the substrate is equal to 1.

In this way, the effective emissivity of the backside of the substrate is increased to the ideal value of one ($\in$=1) and the effect of the substrates actual emissivity on the temperature can be disregarded. Thus, due to the black body cavity 418, the temperature measured by probe 470 can be considered emissivity independent of the substrate backside emissivity. Additionally, if desired, aperture 474 can be positioned in a small reflective cavity (microcavity) formed in the surface of reflector 402. A surface microcavity further enhances the virtual black body effect of reflective cavity 418 and thereby increases the effective emissivity of the substrate to a value that is even closer to one. Other temperature measurement devices or probes, 477, 478, and 479 similar to temperature measurement device 470 can be included to enable temperature measurement at various locations on the backside of substrate 200.

Unfortunately, however, in reality the reflectiveness of reflector 402, although close to one, is not equal to one because for example the cavity 418 or the reflector 402 will not be perfectly reflective and therefore the temperature measured by probe 470 will not be completely independent of the emissivity of the substrate.

Figure 4D:
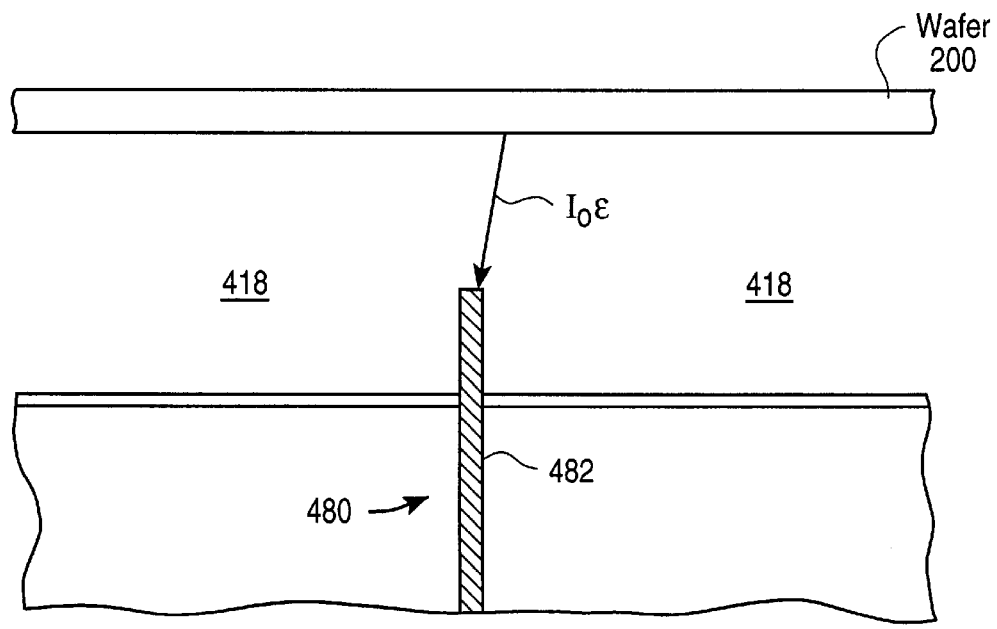
FIG. 4d illustrates the positioning of a temperature measurement device in a virtual black body cavity which is emissivity dependent.

Apparatus 400 therefore includes a second temperature measurement device or probe 480. As shown in FIGS. 4a and 4d, light pipe 482 is raised above reflective surface 402 to within about 3–4 millimeters of the backside of substrate 200. In this configuration, the effective emissivity or reflectivity of the second probe 480 will be smaller than the effective emissivity or reflectivity of the first probe 470. By raising light pipe 482 of probe 480 above reflective surface 402, light pipe 482 receives only radiation directly from the backside of substrate 200 as shown in FIG. 4d. The intensity of radiation received by light pipe 482, therefore is essentially $I=\in\sigma T^4$. As such the intensity of radiation detected by probe 480 is considered emissivity dependent. Probe 480 can be said to be "an emissometer". Probes 470 and 480 should be position close enough together so that they measure temperature at substantially the region of substrate 200 but no to close to interfere with one another. A spacing of 1 to 3 cm has been found to be sufficient. Alternatively, to placing probe 480 close to the backside of substrate 200, it can be placed in a cylindrical micro cavity which has its bottom covered with a non-reflective material.

By utilizing two probes 470 and 480 yielding different effective emissivities or effective reflectivity's to measure the temperature of a substrate at a single location, one can effectively calculate or determine the actual emissivity ($\in$) of the substrate during processing. A well known method of calculating the actual emissivity of a wafer from two probes yielding different emissivities is set forth in U.S. Pat. No. 5,660,472 assigned to the present assignee and which is hereby incorporated by reference. The actual emissivity of the substrate can be used to correct the temperature measurement of probe 470. In this way apparatus 400 can accurately determine the temperature of substrate 200 or the emissivity of substrate 200 while substrate 200 is being processed.

Additionally, in an embodiment of the present invention rapid thermal heating apparatus 400 utilizes a closed loop temperature control system for monitoring and controlling the temperature of substrate 260 during processing. Temperature measurement devices 470 and 480 monitor radiation emitted from the backside of substrate 200 and provide signals indicative of the radiation received to a multi input/multi output controller 490 such as a computer system which includes a central processing unit (CPU) such as a microprocessor and a memory which stores in the form of executable code a system control program which includes various algorithms or subroutines for controlling the temperature, pressure, gas flows, and other aspects of apparatus 400. Controller 490 includes an input and an output device, such as a keyboard and a CRT terminal, respectively, for loading programs, process parameters, and for generally controlling the operation of apparatus 400. A temperature control algorithm stored in temperature controller 490 is used to calculate the temperature sensed by probes 470 and 480. The temperature control algorithm then determines and provides power set points to a multi zone lamp driver 492 which in turn causes lamps to provide more or less heat (radiation) to substrate 200 so that the temperature of substrate 200 can be increased, decreased, or maintained at or to a desired temperature set point provided by a specific process recipe.

Although the present invention is described as being carried out in a specific rapid thermal processing (RTP)

apparatus, 400 shown in FIG. 4, it is to be appreciated that the present invention is not to be limited to this specific rapid thermal processor and that other processing apparatuses with suitable features and capabilities may also be used.

Figure 3A:
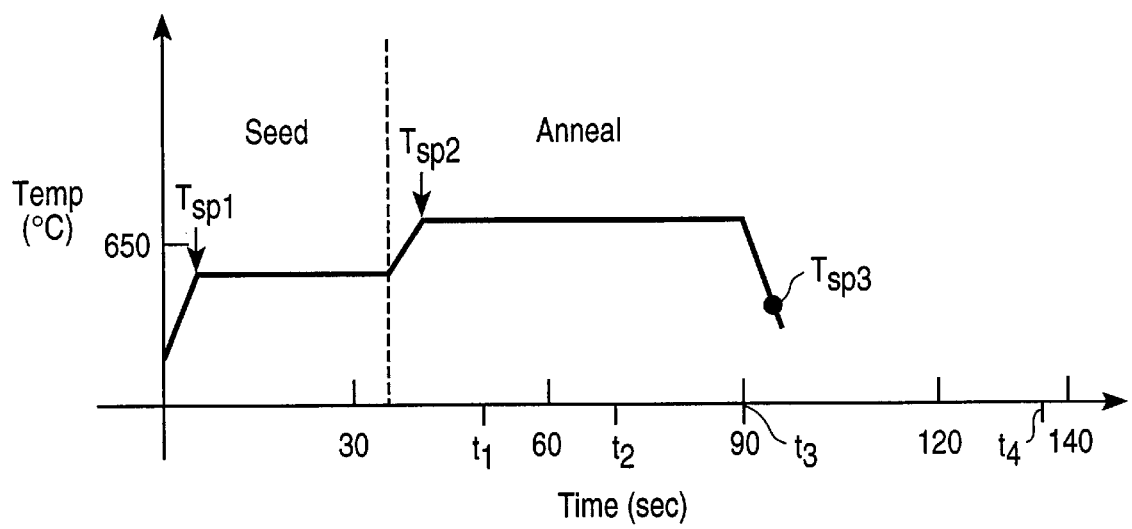
FIG. 3a is a graph which shows temperature set points for an HSG silicon formation process.

FIG. 3a is a graph which illustrates temperature set points for a process recipe used to form hemispherical grain silicon. Substrate 200 is placed on support ring 462 in process chamber 413 which is at an idle temperature of approximately 450–500° C. Substrate 200 is then heated to a first temperature set point (Tsp1) which is a temperature below the crystallization temperature of amorphous silicon film 208 and 204, which is typically about 650° C. It takes approximately five seconds for lamps 419 to heat substrate 200 to the initial set point temperature.

Figures 1, 2C:
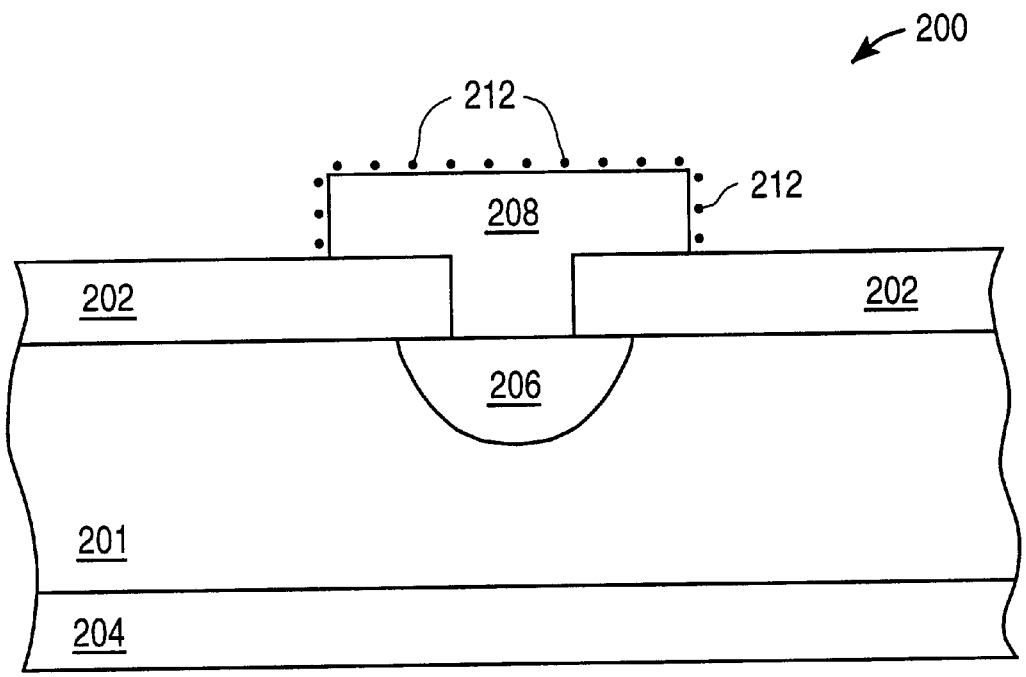
FIG. 2c-1 is an illustration of a cross-sectional view showing the seeding of the substrate of FIG. 2b.
Figures 2, 2C:
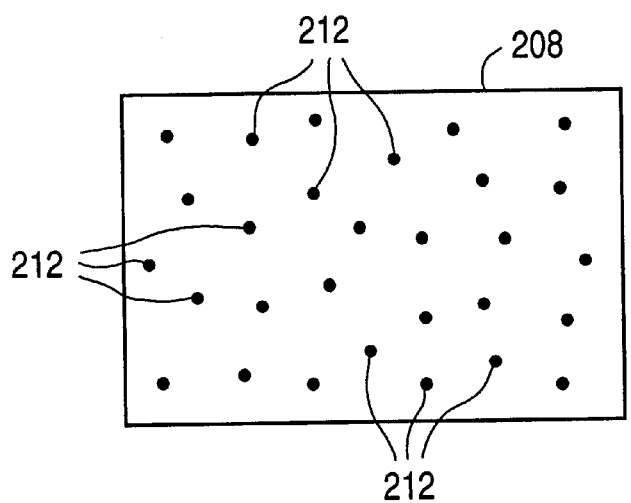

Once substrate 200 has reached the first temperature set point, a small amount of seeding gas, such as but not limited to silane ($SiH_4$) and disilane ($Si_2H_6$) is fed into the process chamber 413. The seeding gas provides nucleation cites 212, as shown in FIGS. 2c-1 and 2c-2 from which hemispherical grains can grow during the subsequent annealing. Substrate 200 can be sufficiently seeded by providing approximately 10 sccm of silane into process chamber 413 for approximately 30 seconds while the pressure within the chamber 413 is maintained at approximately three mtorr.

Once substrate 200 has been sufficiently seeded, the flow of seeding gas is turned off, and the set point temperature increased, as set forth in FIG. 3a, to a second temperature (Tsp2) which is the anneal temperature. The anneal temperature is at least the crystallization temperature of silicon which is approximately 650° C. Because during annealing there is no flow of gas into chamber 413, the chamber pressure drops to approximately $10^{-7}$ torr during annealing. A low deposition pressure is valuable in that residual oxygen is removed so that no oxides ($SiO_2$) form on amorphous film 204 which can impede the growth of grains on the surface of electrodes 208.

Figures 1, 2D:
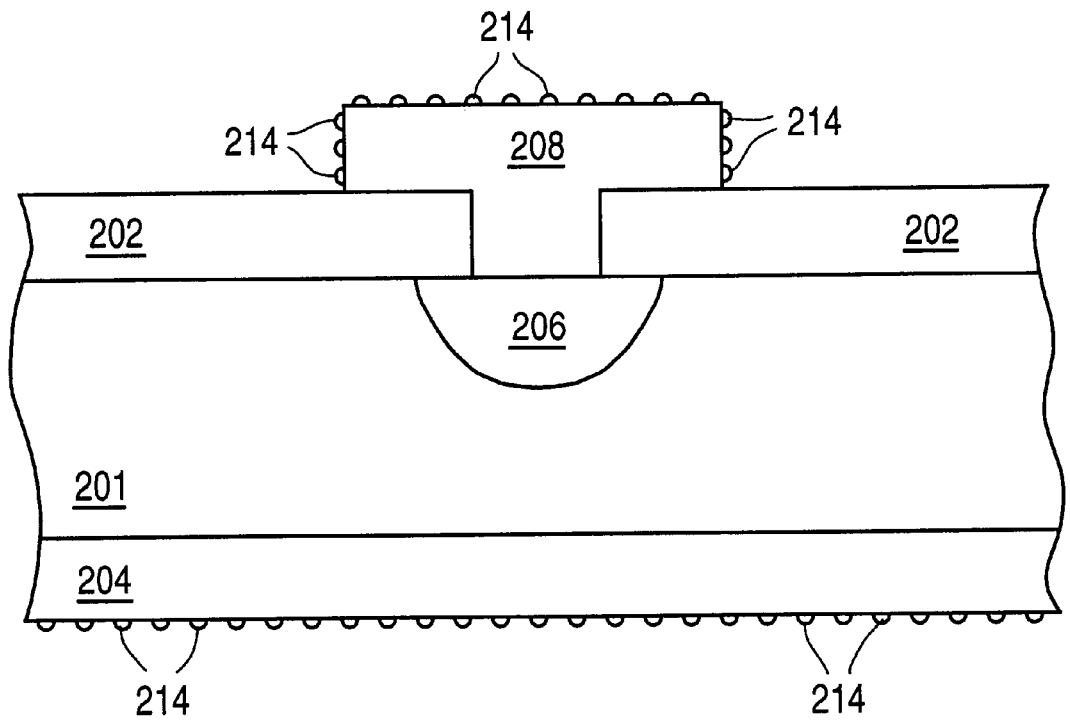
Figures 2, 2D:
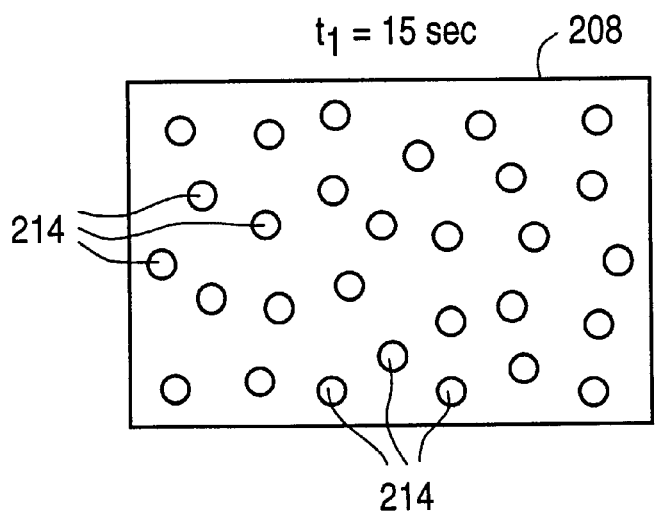
Figures 1, 2E:
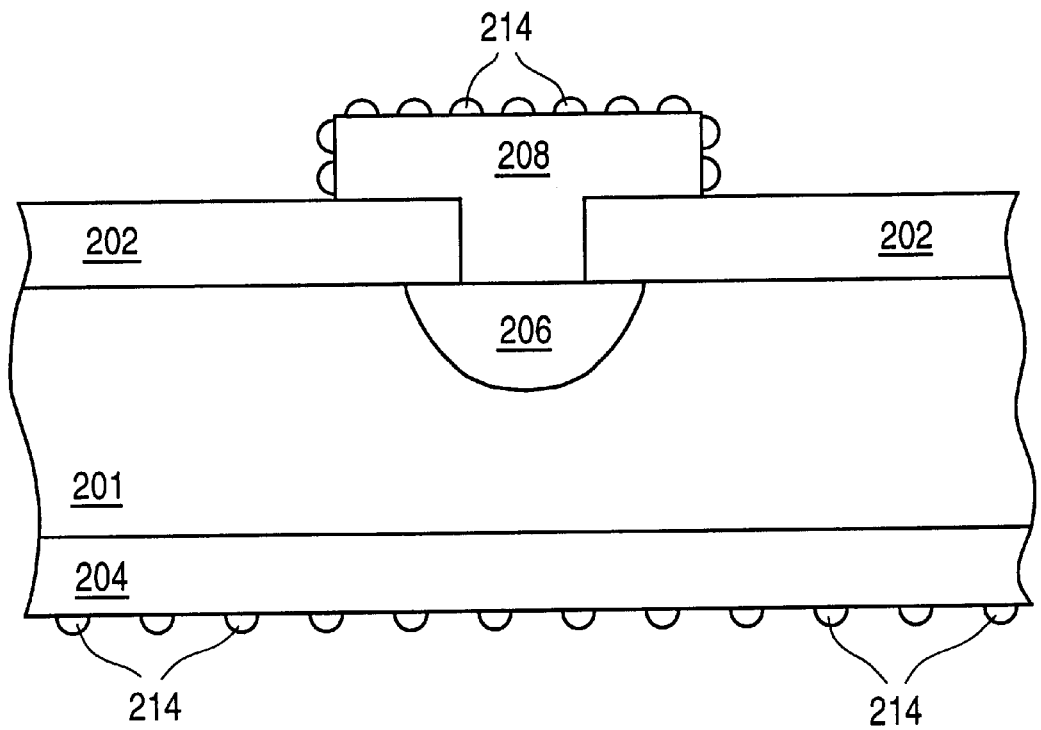
Figures 2, 2E:
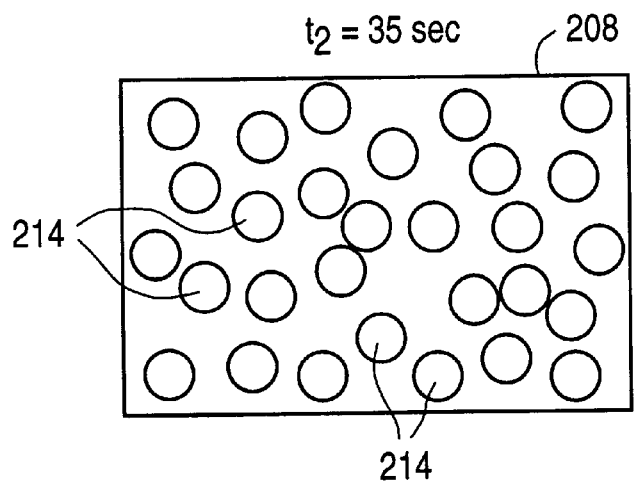
Figures 1, 2F:
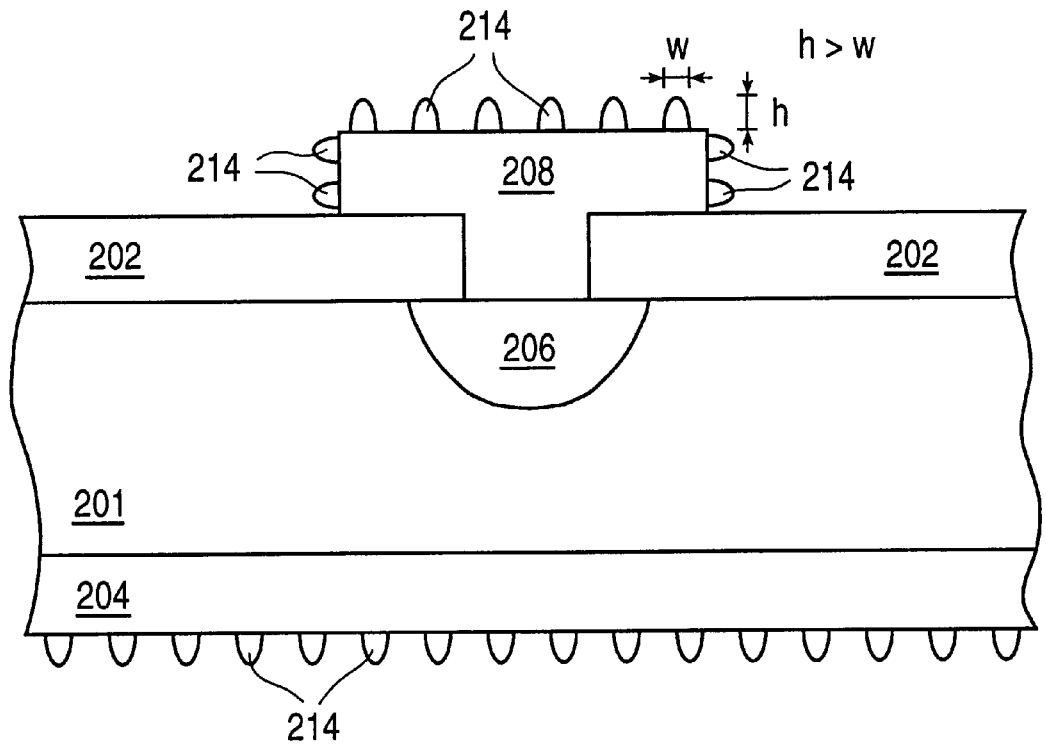
Figures 2, 2F:
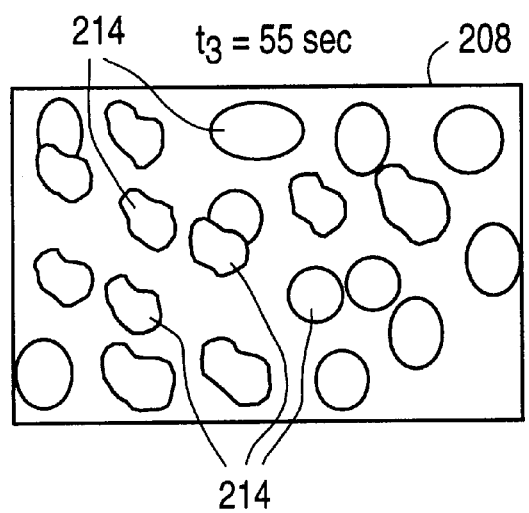
Figures 1, 2G:
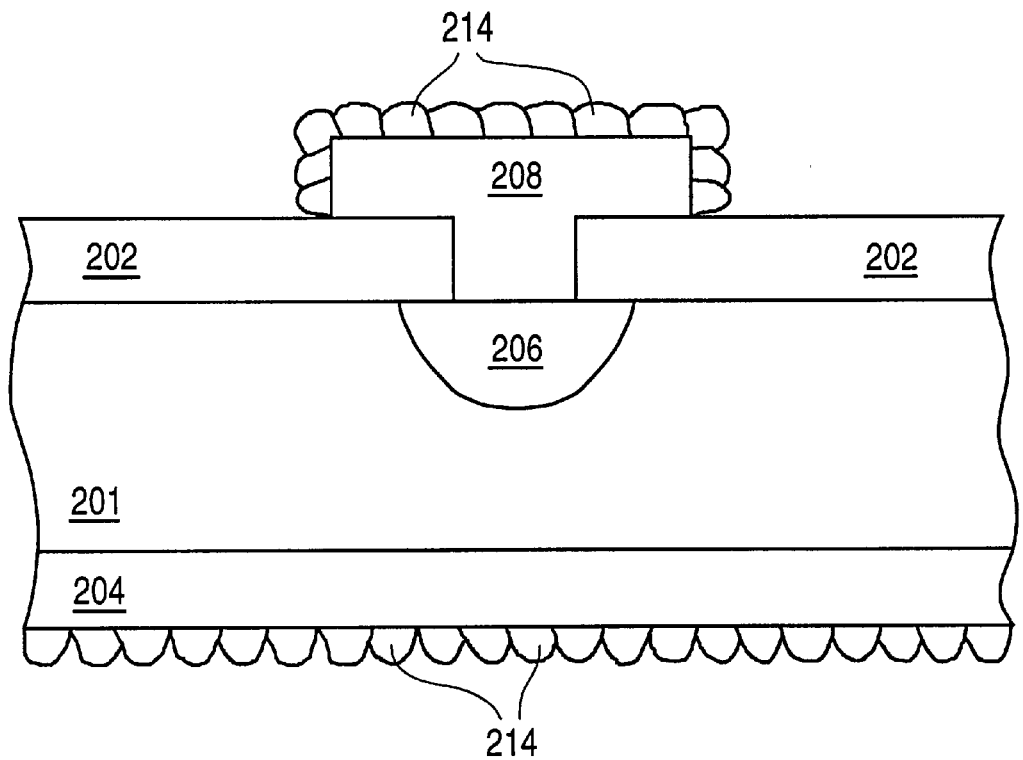
Figures 2, 2G:
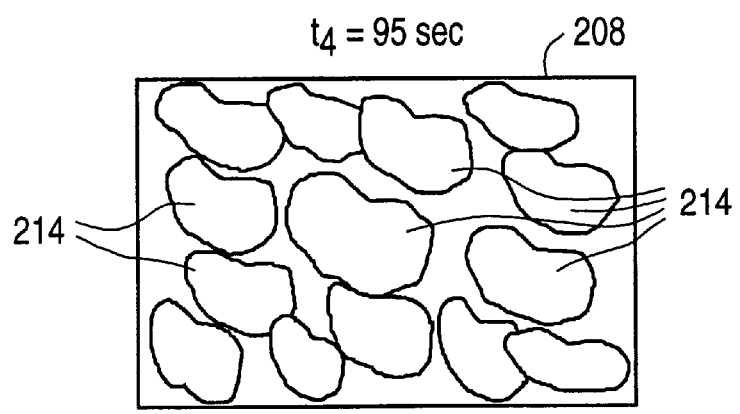
Figure 2H:
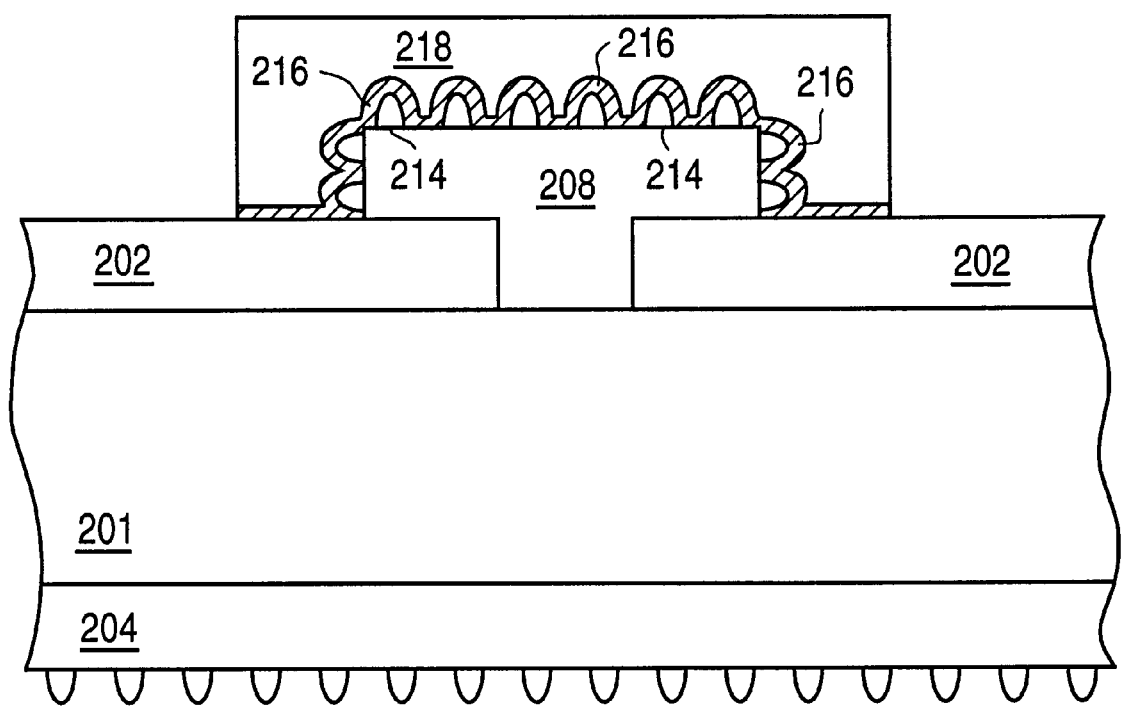
FIG. 2h is an illustration of cross-sectional views showing the formation of a capacitor dielectric and a top capacitor electrode on the substrate of FIG. 2f.

After a small amount of time, $t_1$, of annealing or heating substrate 200 at a temperature greater than 650° C. grains 214 begin to grow from nucleation sites 212 and the underlying amorphous silicon film begins to crystallize as illustrated in FIGS. 2d-1 and 2d-2. It is to be appreciated that grains 214 also grow on the backside of substrate 200 from the amorphous silicon film 204 on the backside. As annealing is continuing to a time $t_2$, silicon grains 214 become larger and the underlying amorphous film further converts to polycrystalline silicon as illustrated in FIGS. 2e-1 and 2e-2. As anneal time is continued to time $t_3$, the grains become even larger and reach their optimum size and shape as illustrated in FIGS. 2f-1 and 2f-2. Optimum size for grains 214 is when the height(h) of the grains is as great as or greater than the width(w) and when the grains are sufficiently spaced from one another to enable additional films to be deposited between grains. In this way polysilicon capacitor electrodes having a maximum surface area can be formed. If annealing is continued to a time, $t_4$, grains continue to grow and fill in the gaps between adjacent grains, resulting in an undesired smoothing of the electrode surface as illustrated in FIGS. 2g-1 and 2g-2. Such a smoothing of the surface decreases the surface area of the capacitor electrode which in turn decreases the storage capacity of the cell. As such it is extremely important to be able to determine when grains have reached their optimum size and shape, so that the annealing step can be stopped by reducing the substrate temperature to a third setpoint temperature (Tsp3) which is below the crystallization temperature of silicon. In this way the rough surface on electrodes 208 can be preserved to enable maximum storage capacity for the cell.

Figure 3B:
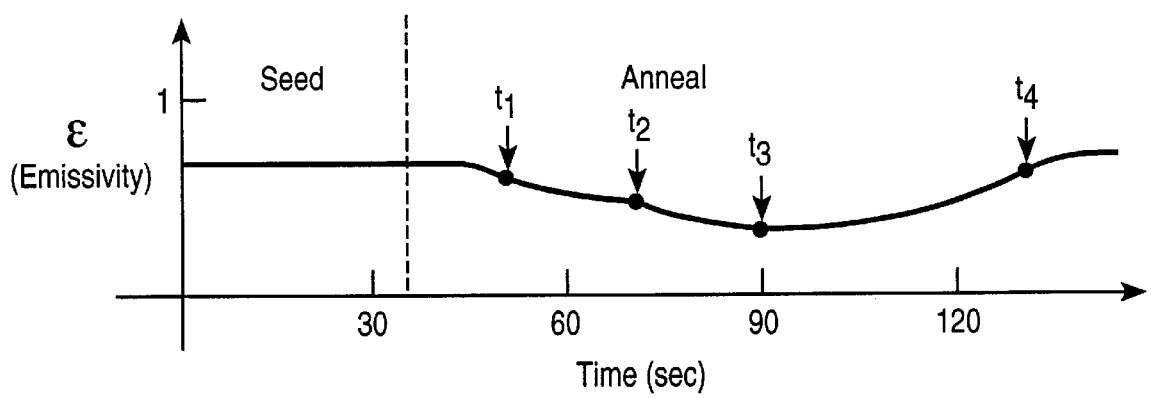
FIG. 3b is a graph which illustrates how emissivity changes over time during an HSG formation process.

FIG. 3b is an illustration of how the emissivity of substrate 200 can change during the formation of HSG silicon. During the initial seeding step, silicon film 204 remains substantially unchanged and as such the emissivity of the substrate remains constant as illustrated in FIG. 3b. At time, $t_1$ during the anneal step and the onset of HSG, as illustrated in FIG. 3b, the emissivity of the substrate begins to decrease due to HSG grain growth. At time $t_2$, the emissivity continues to decrease as HSG grains become larger. The emissivity continues to decrease until a minimum emissivity is reached at time $t_3$ where the grains size is the largest and the surface the roughest. Further annealing after time $t_3$ causes grains to grow between adjacent grains resulting in a coalescence of grains and a smoothing of the surface and a resulting increase in the surface emissivity of wafer 200 as illustrated in FIG. 3b. As such, by continually monitoring (at least 20 times/second) the emissivity of substrate 200 during the anneal step, one can monitor the formation of HSG silicon and utilize emissivity changes or values to indicate the end point of the HSG formation step.

The backside emissivity of substrate 200 can be continually calculated and monitored during the formation of HSG silicon by sampling the radiation emitted by the backside of substrate 200 with probes 470 and 480 "on the fly" and sending the sampled values to temperature controller 490 and utilizing an emissivity calculating algorithm in the system control program to then calculate or determine the emissivity of the substrate while the substrate is being heated. It is to be noted that although the relevant HSG formation is on the top side of substrate 200 where the capacitors electrodes 208 are being formed, the substrate backside emissivity can be monitored because HSG silicon correspondingly forms from the amorphous silicon film 204 formed on the backside of substrate 200. Sampling radiation 20 times per second provides a sufficient number of emissivity calculations to adequately monitor the processing of substrate 200. An end point detection algorithm in the system control program can be utilized to look for a predetermined change in the emissivity, a rate of change (derivative) of the emissivity, or a specific emissivity of the substrate to signal and end to the HSG formation step and accordingly provide a third temperature set point (Tsp3) that reduces the heat output of lamps 419 to cause a temperature substrate 200 to fall below the minimum crystallization temperature of silicon.

In one embodiment of the present invention the end point detection program looks for a given emissivity to indicate the end point. In another embodiment of the present invention, the end point detection program detects a given change (e.g. decrease) in the emissivity of the substrate as compared to the emissivity of the substrate from its initial constant value. In yet another embodiment of the present invention an end point detection algorithm detects the minimum emissivity of the process by detecting an increase in the emissivity of the substrate after the substrate has reached a predetermined minimum value. In still yet another embodiment of the present invention the end point detection algorithm looks for an incremental increase in emissivity of the substrate after an incremental decrease in the emissivity of the substrate.

In another embodiment of the present invention, the surface temperature of substrate 200 is utilized to monitor and/or end point detect the formation of HSG silicon. Surface temperature can be utilized to monitor and/or end point detect the formation of HSG silicon, because as HSG silicon forms, the emissivity of the substrate changes which causes a change in the surface temperature of the substrate.

When the surface temperature of substrate, 200, is used to monitor or end point detect a process, the amount of heat provided to the substrate (e.g. the amount of power supplied to lamps 319) must remain constant during the monitored period so that changes in the substrate's temperature will be due to changes in the surface morphology and not due to changes in the amount of heat provided to the substrate. That is, when using the surface temperature of a substrate to monitor or end point detect a process, the process should be carried out in a "open loop" system wherein there is no feed back in the temperature control system so that the temperature control system does not alter the amount of heat provided to the substrate in an attempt to maintain the substrate at a constant temperature. In an open loop system, the substrate temperature is not maintained at a set point temperature but is allowed to fluctuate to any steady state temperature.

Figure 3C:
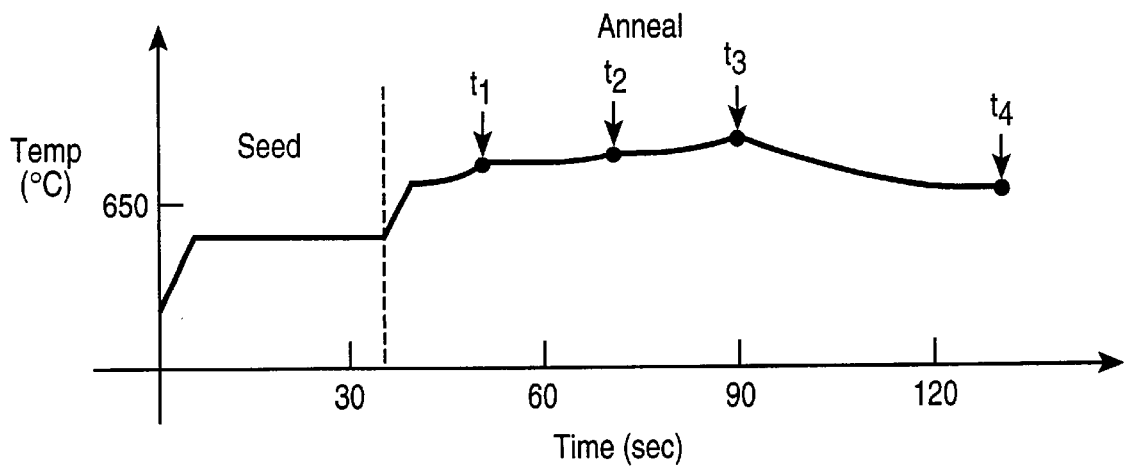
FIG. 3c is a graph which illustrates how substrate temperature changes with respect to time during a HSG silicon formation process.

FIG. 3c, is an example of how surface temperature of substrate 200 changes during the formation of HSG silicon in an apparatus having an open loop control system. As shown in FIG. 3c, during the seeding step, the temperature of substrate 200 is raised to the seeding temperature, Tsp1, by increasing the power provided to lamps 319. Once substrate 200 reaches the seeding temperature, Tsp1, the temperature of the substrate remains substantially constant because the surface characteristics of the substrate does not change during seeding. After sufficiently seeding substrate 200, the temperature of substrate 200 is raised to the anneal temperature, Tsp2, by increasing the amount of power supplied to lamps 319. Once substrate 200 reaches the anneal set point temperature, Tsp2, the amount of power supplied to lamps 319 is held constant so that a constant amount of heat is supplied to substrate 200 during the anneal step. After the substrate 200 has been annealed for a time $t_1$, the temperature of the substrate begins to increase to a temperature greater than annealed set temperature (Tsp2) due to the formation of HSG silicon. As substrate 200 is annealed for a time $t_2$, the surface becomes rougher and the temperature of substrate 200 correspondingly increases. At anneal time $t_3$, the grains reach their optimum size and shape and the substrate temperature reaches a maximum. If annealing is continued to a time $t_4$, the substrate temperature begins to drop as new grains began fill in the gaps between adjacent grains. As such by continually monitoring (at least 20 times/sec) the surface temperature of substrate 200 while supplying a constant amount of power to lamps 319 one can monitor the formation of HSG silicon and use temperature changes, rate of changes, or absolute temperatures to monitor HSG formation and/or to indicate the end point of the HSG formation step.

In an embodiment of the present invention, changes in the substrate temperature under constant power conditions are utilized to monitor and/or end point detect the formation of HSG silicon. The temperature of substrate 200 can be continually calculated and monitored during HSG silicon formation, by sampling radiation emitted from the backside of substrate 200 with probes 470 and 472 then sending the sampled values to a temperature calculating algorithm in the system control program. The radiation detect by probe 480 can be utilized to derive a corrected and more accurate temperature reading made by probe 470. The corrected temperature sensed by probe 470 can then be used to accurately provide the temperature of substrate 200 during the processing of substrate 300.

In an embodiment of the present invention an end point detection algorithm in the system control program can be used to detect predetermined temperature changes or predetermined rate of temperature changes or to detect predetermined values in the temperature to signal an end to the HSG formation step and accordingly an end to the anneal step. Although the temperature of substrate 200 is preferably monitored utilizing radiation from probe 470 corrected by probe 480 other methods or components such as a thermocouple coupled to substrate 200 can be used to monitor the temperature of substrate 200 during processing.

Figure 3D:
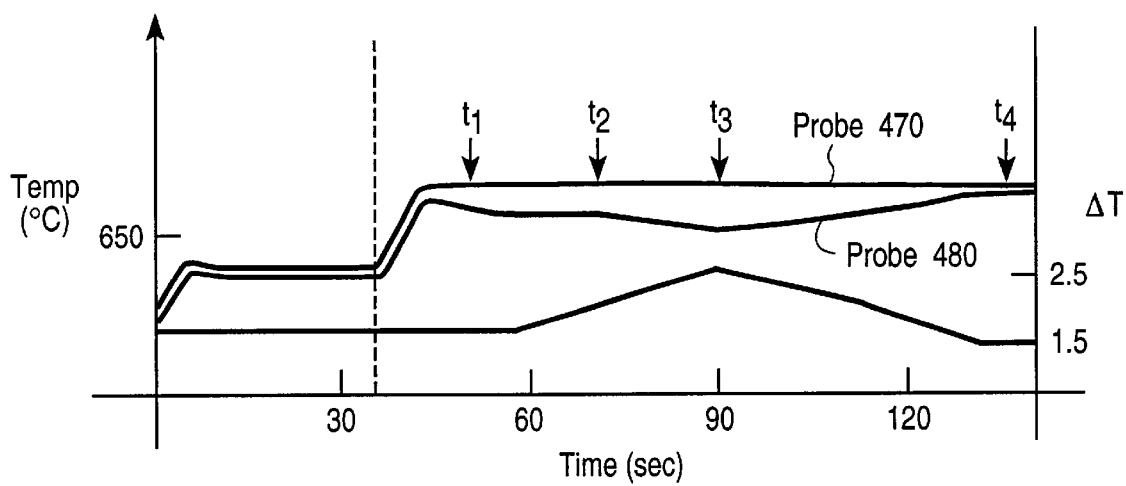
FIG. 3d is a graph which illustrates the temperatures measured by a substantially emissivity independent probe and an emissivity dependent probe during an HSG silicon formation process. Additionally.

FIG. 3d is a graph which illustrates how the temperature measured by probe 470 and probe 480 change over time during the formation of HSG silicon. Also shown in FIG. 3d is the difference in temperature (ΔT) between the temperature measured by probe 470 and probe 480. The difference ΔT provides a clear signal which can be utilized to monitor the HSG formation process. As can be seen in FIG. 3d, the difference between the measured temperatures remains substantially constant during the seeding step. At time $t_1$ during the onset of HSG silicon, the difference between the measured temperatures begins to increase. As the grains becomes larger at time $t_2$, the difference in the measured temperatures increases further. At time $t_3$ when the grains have reached their optimum size and shape the difference in the measured temperature is the greatest. Further annealing of substrate 200 to a time $t_4$ causes the difference between the measured temperatures to begin to decrease. The difference between the measured temperature of probe 470 and 480 provides a clear maximum which can be used to detect the completion of HSG silicon formation. As such, by continually monitoring (at least 20 times/sec) the difference in the temperatures measured by probes 470 and 480 HSG silicon formation can be monitored and end point detection is possible.

It is to be noted that the temperature measured by probe 470 remains comparably stable as compared to temperature measured by probe 480. Probe 480 experiences greater fluctuations in recorded temperature because probe 480 is more emissivity dependent than the essentially emissivity independent probe 470. As such, as HSG silicon forms and as more silicon film converts into polycrystalline silicon, the emissivity of the substrate begins to change resulting in a greater difference in the temperatures measured by probes 470 and 480.

In an embodiment of the present invention and end point detection algorithm in the system control program detects a predetermined difference or a predetermined change in the difference or a rate of change in the difference between the temperature measured by probe 150 and 152 to signal and end to the HSG formation step.

In another embodiment of the present invention, the power requirements of lamps 419 are utilized to monitor and/or end point detect the formation of HSG silicon. In this embodiment of the present invention. Rapid thermal heating apparatus 400 utilizes a well known closed loop temperature control system to control the heating substrate 200. In a closed loop temperature control system, a temperature set point is provided by an operator or by a stored process recipe, to a temperature control algorithm such as a well known proportional integral derivative (PID) algorithm. The temperature control algorithm then calculates the amount of power (power set points) for driver 492 to provide to lamps 419 in order to heat substrate to the specified temperature set point. As the substrate changes temperatures, thermal probe 470 constantly provides temperature feedback to the temperature control algorithm which in turn calculates a difference or error between the temperature set point and the substrates actual temperature and utilizes the error to determine a new power set point for the lamps. In such a closed loop temperature control system, the temperature readings are constantly (at least 20 times/sec) fed to the controller 490 which adjust the power to the lamps in order to achieve or maintain a specified temperature set point.

Figure 3E:
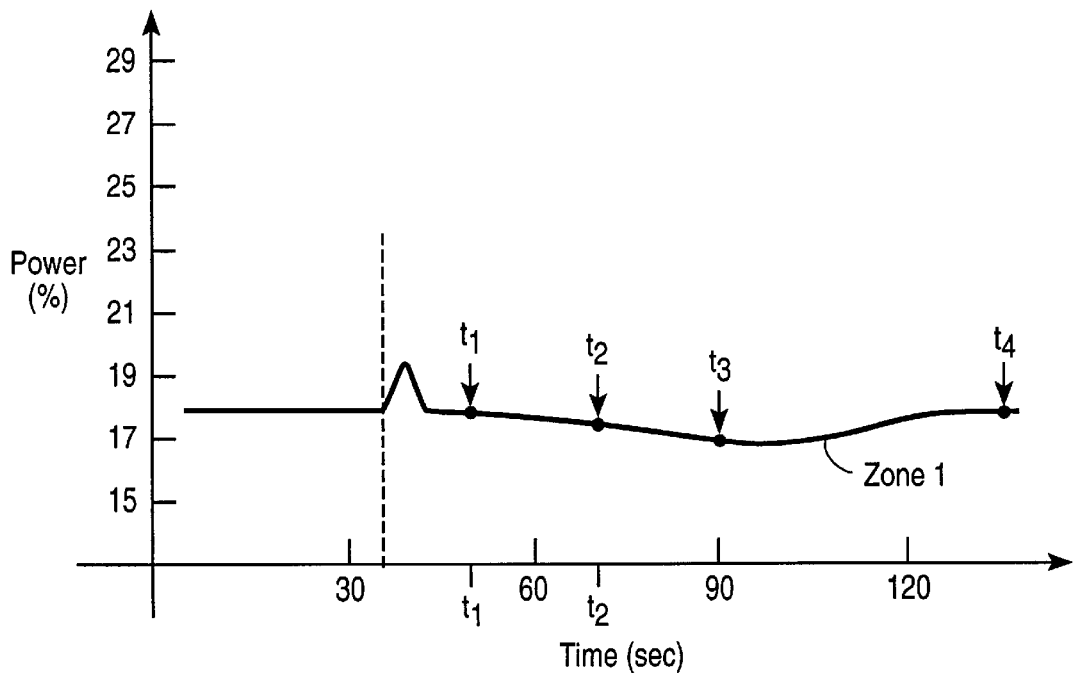
FIG. 3e is a graph which illustrates the power requirements of a closed loop temperature control system with respect to time during an HSG silicon formation process.

FIG. 3e is a graph which shows how a percentage of power supplied to lamps 419 changes with respect to time during the formation of HSG silicon. As shown in FIG. 3e, during the seeding step the percentage of power supplied to the lamps remains substantially constant because the substrates temperature remains constant. When the annealing step begins, and the temperature set point increase to the anneal temperature (Tsp2), the percentage of power supplied to the lamps increases in order to provide more heat from lamp 419 and thereby increase the temperature of the substrate 200. Typically, in a PID algorithm when ramping the temperature of a substrate more power is initially provided to the lamps than is necessary to obtain steady state at the set point temperature. In this way the substrate can be ramped to a new set point temperature faster. As the substrate's temperature moves closer to the set point temperature, the percentage of power is decreased to a percentage which is closer to the percentage necessary to obtain steady state at the set point temperature. As the substrate is annealed, the set point temperature remains constant. However, because of the formation of HSG silicon, the emissivity of the substrate begins to change at time $t_1$ causing a resulting increase in the temperature of the substrate. Because the temperature control system is a closed loop system, it automatically decreases the power provided to the lamps in order to maintain the substrate at the set point temperature. As such as HSG silicon begins to form it causes the emissivity of the substrate to change which results in a change in the amount of energy absorbed by the substrate from the lamps and emitted by the substrate to the chamber ambient which in turn causes the close loop system to change the amount of power supplied to lamps. Thus, one can monitor the amount (percentage) of power supplied to the lamps while the temperature set point remains constant during annealing in order to monitor and/or end point detect the formation of HSG silicon.

In one embodiment of the present invention, an end point detection algorithm is provided which monitors (at least 20 times/sec) the amount of power supplied to lamp 419 during anneal step in order to signal an end to the HSG anneal step. The end point detection algorithm can utilize a change in the % of power supplied to the lamps, a rate of change of or power supplied an absolute power value in order to signal an end to HSG formation step.

Once HSG polysilicon has been sufficiently formed on bottom capacitor electrode 208, the processing is continued to complete fabrication of the capacitor cell. For example, a capacitor dielectric 216 of for example silicon oxide, silicon nitride, or a transition metal oxide, such as tantalum pentaoxide, is blanket deposited over ILD 202 and the bottom electrode 206. Next a top capacitor electrode material, of for example polycrystalline silicon or a metal such as titanium nitride or tungsten, is blanket deposited over the capacitor dielectric. The top capacitor electrode material and the capacitor dielectric layer of are then patterned with well known photolithography and etching technique to form a top capacitor electrode 218. At this point the process of fabricating a stacked capacitor is complete. Well known semiconductor processing steps such as metal interconnecting and passivations steps can be used to process substrate 200 into a functional dynamic random access memory (DRAM).

Thus, during the formation of HSG silicon, surface characteristics such as temperature and emissivity of a substrate change due to the transformation of the amorphous silicon film into HSG polysilicon. By recording substrate characteristics, such as emissivity and temperature, during the formation of HSG silicon, a signatures of the process such as shown in FIGS. 3b–3e, can be obtained. It is to be appreciated that emissivity and temperature signatures, shown in FIGS. 3b–3e, are a characteristic of the particular film stack on the substrate and can change substantially for different film thicknesses and dopent concentration of the amorphous silicon film as well as underlying layers. As such different substrate profiles well exhibit different surface characteristics signatures. By utilizing well known techniques and equipment such as scanning electron microscopes (SEM), transmission electron microscope (TEM) and atomic force microscope (AFM), one can to correlate grain size and shape with specific locations (times) on the signature graphs illustrated in FIGS. 3b–3e. A further correlation to grain size and shape can be made by making electrical structures (capacitors) from the HSG silicon formed at various anneal times and correlating this electrical data to the signatures shown in FIGS. 3b–3e. In this way any of HSG silicon formation process can be precisely controlled and monitored to achieve optimum grain size and shape to enable maximum storage capacity per cell size.

As such a method for monitoring and/or end point detecting the formation of HSG silicon has been described. It is to be appreciated that although the present invention has been described with respect to the formation of HSG silicon, the techniques of the present invention can be used to monitor and/or end point detect other processes. For example, substrate characteristics, such as surface emissivity or temperature, or the power requirements of a closed loop temperature control system can be continuously sampled in order to monitor and/or end point detect processes such as film deposition, and film crystallization. As such the detailed description of the present invention should be taken as illustrative rather than limiting wherein the scope of the present invention is to be measured by the appending claims which follow.

Thus, methods and apparatuses for monitoring and end point detecting a process have been described.

What is claimed is:

1. A method of monitoring a process step comprising:

processing a semiconductor substrate;

while processing said semiconductor substrate, monitoring the temperature of said substrate utilizing a temperature measurement device which is substantially independent of said substrates emissivity;

while processing said substrate measuring the temperature of said substrate utilizing a temperature measurement device which is dependent on said substrates emissivity;

while processing said substrate determining the difference between the temperature measured by said substantially emissivity independent measurement device and the temperature measured by said emissivity dependent measurement device; and utilizing a change in the difference in said temperatures to signal an end to said processing step.

2. A method of signaling an end to a process step comprising:

heating a substrate with a temperature control apparatus having a closed loop control which maintains the substrate at a predetermined set point temperature;

monitoring the amount of power utilized by said temperature control apparatus; and utilizing a change in the amount of power utilized by said temperature control apparatus to signal an end to said heating step.

3. An apparatus for processing the substrate, said apparatus comprising:

a substrate support;

a heat source;

a controller for controlling power to said heat source; and a memory coupled to said controller, said memory storing a computer readable program comprising:

instructions for determining the amount of power to provide to said heat source to maintain said substrate at a predetermined set point temperature, and instructions for determining a change in the amount of power supplied to said heat source while maintaining said substrate at said predetermined temperature and instructions for ending a process occurring in said apparatus when a predetermined change in the amount of power supplied to said heat source is obtained.

4. An apparatus for processing a substrate, said apparatus comprising:

a substrate support;

a heat source;

a first temperature measurement device, said first temperature measurement device being substantially independent of the emissivity of said substrate;

a second temperature measurement device, said second temperature measurement device being dependent on the emissivity of said substrate;

a controller for controlling said heat source; and a memory coupled to said controller, said memory storing a computer readable program having instructions for determining a difference between the temperature measured by said first temperature measurement device and said second temperature measurement device and for determining the end of a process when a predetermined difference between the first temperature measurement device and the second temperature measurement device is obtained.

5. The apparatus of claim 4 wherein said heat source comprises a plurality of lamps.

6. A method of monitoring the formation of hemispherical grain silicon film on a substrate comprising:

placing a substrate having an amorphous silicon film into a process chamber;

heating said substrate to form hemispherical grain silicon from said amorphous silicon film in said process chamber;

while heating said substrate, monitoring the temperature of said substrate utilizing a temperature measurement device which is substantially independent of said substrate emissivity;

while heating said substrate, measuring the temperature of said substrate utilizing a temperature measurement device which is dependent on said substrate emissivity;

while heating said substrate determining the difference between the temperature measured by said substantially emissivity independent measurement device and the temperature measured by said emissivity dependent measurement device; and utilizing a change in the difference of said temperatures measured by said temperature measurement devices to monitor said formation of hemispherical grain silicon from said amorphous silicon film.

7. A method of monitoring the formation hemispherical grain silicon on a substrate comprising:

placing a substrate having an amorphous silicon film in a process chamber;

heating said substrate with a temperature control apparatus having a closed loop control which maintains said substrate at a predetermined set point temperature;

monitoring the amount of power utilized by said temperature control apparatus while heating said substrate; and utilizing a change in the amount of power utilized by said temperature control apparatus to monitor said formation of said hemispherical grain silicon from said amorphous silicon film.

* * * * *